US011818911B2

(12) United States Patent
Liao et al.

(10) Patent No.: US 11,818,911 B2
(45) Date of Patent: Nov. 14, 2023

(54) DISPLAY SUBSTRATE AND MANUFACTURING METHOD THEREOF, DISPLAY PANEL AND DISPLAY APPARATUS

(71) Applicant: BOE Technology Group Co., Ltd., Beijing (CN)

(72) Inventors: Feng Liao, Beijing (CN); Yunsik Im, Beijing (CN); Yoonsung Um, Beijing (CN); Shunhang Zhang, Beijing (CN); Liwei Liu, Beijing (CN); Hongrun Wang, Beijing (CN); Hui Zhang, Beijing (CN); Yue Jia, Beijing (CN); Kai Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 181 days.

(21) Appl. No.: 16/973,161

(22) PCT Filed: Mar. 4, 2020

(86) PCT No.: PCT/CN2020/077749
§ 371 (c)(1),
(2) Date: Dec. 8, 2020

(87) PCT Pub. No.: WO2020/177711
PCT Pub. Date: Sep. 10, 2020

(65) Prior Publication Data
US 2021/0257580 A1    Aug. 19, 2021

(30) Foreign Application Priority Data
Mar. 6, 2019 (CN) .......................... 201910168089.5

(51) Int. Cl.
*H10K 50/822* (2023.01)
*H01L 25/18* (2023.01)
(Continued)

(52) U.S. Cl.
CPC ......... *H10K 50/822* (2023.02); *H01L 25/167* (2013.01); *H01L 25/18* (2013.01);
(Continued)

(58) Field of Classification Search
CPC ... H01L 25/18; H01L 25/167; H01L 27/1443; H01L 27/3227; H01L 27/3269;
(Continued)

(56) References Cited

U.S. PATENT DOCUMENTS 9,305,989 B2    4/2016    In et al.
2004/0113550 A1*   6/2004   Adachi ............... H01L 27/3262
                                                              313/512
(Continued)

FOREIGN PATENT DOCUMENTS

CN    106816453 A    6/2017
CN    108831912 A    11/2018
(Continued)

OTHER PUBLICATIONS

Office Action dated Jul. 24, 2020 issued in corresponding Chinese Application No. 201910168089.5.
(Continued)

*Primary Examiner* — Shaun M Campbell
*Assistant Examiner* — Aneta B Cieslewicz
(74) *Attorney, Agent, or Firm* — Nath, Goldberg & Meyer; Joshua B. Goldberg

(57) ABSTRACT

The disclosure provides a display substrate and a manufacturing method thereof, a display panel and a display apparatus. The display substrate includes a substrate and an electroluminescent layer on the substrate. The display substrate further includes a first reflective electrode layer, a buffer layer and a second reflective electrode layer sequentially formed on a side of the electroluminescent layer distal to the substrate. The buffer layer is provided with a first
(Continued)

hollow region, the second reflective electrode layer is provided with a second hollow region, an overlapping region between the first hollow region and the second hollow region is configured to transmit light emitted by the electroluminescent layer. The present disclosure can detect the light-emitting brightness of each sub-pixel in the organic electroluminescent layer in real time to improve light-emitting efficiency.

16 Claims, 9 Drawing Sheets

(51) Int. Cl.
- *H01L 25/16* (2023.01)
- *H10K 50/826* (2023.01)
- *H10K 59/13* (2023.01)
- *H10K 59/60* (2023.01)
- *H01L 27/144* (2006.01)
- *H10K 59/122* (2023.01)
- *H10K 59/12* (2023.01)

(52) U.S. Cl.
CPC ........... *H10K 50/826* (2023.02); *H10K 59/13* (2023.02); *H10K 59/60* (2023.02); *H01L 27/1443* (2013.01); *H10K 59/1201* (2023.02); *H10K 59/122* (2023.02)

(58) Field of Classification Search
CPC ... H01L 27/3246; H01L 51/5221–5234; H01L 2227/323; H01L 51/5225; H01L 51/5228; H10K 50/822; H10K 50/824; H10K 50/826; H10K 59/13; H10K 59/60; H10K 59/122; H10K 59/1201
See application file for complete search history.

(56) References Cited

U.S. PATENT DOCUMENTS

| | | | |
|---|---|---|---|
| 2006/0017375 A1* | 1/2006 | Noguchi | H10K 50/828 313/506 |
| 2013/0187135 A1* | 7/2013 | Yan | H10K 59/12 257/40 |
| 2017/0271416 A1* | 9/2017 | Ryu | H01L 25/167 |
| 2017/0217112 A1 | 11/2017 | Yamazaki et al. | |
| 2018/0122879 A1 | 5/2018 | Jin et al. | |
| 2018/0366524 A1* | 12/2018 | Bang | H01L 51/0021 |

FOREIGN PATENT DOCUMENTS

| | | |
|---|---|---|
| CN | 109065582 A | 12/2018 |
| CN | 109148536 A | 1/2019 |
| CN | 109860265 A | 6/2019 |
| JP | H2009-238833 A | 10/2009 |

OTHER PUBLICATIONS

Office Action dated Jan. 26, 2021 issued in corresponding Chinese Application No. 201910168089.5.

* cited by examiner

DISPLAY SUBSTRATE AND MANUFACTURING METHOD THEREOF, DISPLAY PANEL AND DISPLAY APPARATUS

CROSS-REFERENCE TO RELATED APPLICATIONS

This is a National Phase Application filed under 35 U.S.C. 371 as a national stage of PCT/CN2020/077749, filed Mar. 4, 2020, an application claiming the benefit of Chinese Patent Application No. 201910168089.5, filed on Mar. 6, 2019, the content of each of which is incorporated herein by reference in its entirety.

TECHNICAL FIELD

The present application relates to the field of display technology, and particularly relates to a display substrate and a manufacturing method thereof, a display panel and a display apparatus.

BACKGROUND

An Organic Light-Emitting Diode (OLED) display apparatus has been regarded as a next generation display product with a prospect due to its advantages of a light and thin profile, a wide viewing angle, active light emission, continuously adjustable light color, a low cost, a high color gamut, a high contrast, a fast response speed, a low energy consumption, a low driving voltage, a wide working temperature range, a simple manufacturing process, high light emission efficiency, flexible display, and the like.

SUMMARY

The disclosure provides a display substrate and a manufacturing method thereof, a display panel and a display apparatus. The display substrate includes a substrate and a plurality of electroluminescent layers on the substrate, at least one of the plurality of electroluminescent layers is provided with a first reflective electrode layer, a buffer layer and a second reflective electrode layer on a side distal to the substrate; the buffer layer is provided with a first hollow region, the second reflective electrode layer is provided with a second hollow region, an overlapping region between the first hollow region and the second hollow region is configured to transmit light emitted by the electroluminescent layer, and an orthographic projection of the electroluminescent layer on the substrate covers an orthographic projection of the overlapping region on the substrate.

In some embodiments, the first reflective electrode layer has a thickness of 200 Å-1000 Å.

In some embodiments, a material of the first reflective electrode layer includes one of ITO-Cs, Li3PO3/Al, MgAg, LiAl, Ca/Ag, Ag/Al, and Ba/Al/ITO.

In some embodiments, an area of the orthographic projection of the overlapping region on the substrate is 5% to 30% of an area of the orthographic projection of the electroluminescent layer on the substrate.

In some embodiments, a via hole is further provided in the buffer layer in a region other than the first hollowed region, and the second reflective electrode layer is electrically coupled to the first reflective electrode layer through the via hole.

In some embodiments, the second reflective electrode layer has a thickness of 1000 Å-5000 Å.

In some embodiments, a material of the second reflective electrode layer includes aluminum.

In some embodiments, the orthographic projection of the electroluminescent layer on the substrate does not overlap with an orthographic projection of the via hole on the substrate.

In some embodiments, the display substrate further includes a pixel defining layer on the substrate and in a same layer with the plurality of electroluminescent layers, wherein the pixel defining layer defines a plurality of grids, and the plurality of electroluminescent layers are in the grids of the pixel defining layer, respectively; and the via hole is formed above the pixel defining layer.

In some embodiments, the display substrate further includes a transparent adjustment layer on a side of the second reflective electrode layer distal to the substrate, a refractive index of the transparent adjustment layer is larger than a refractive index of the first reflective electrode layer, and/or the refractive index of the transparent adjustment layer is larger than each of the refractive indexes of the buffer layer and the second reflective electrode layer.

In some embodiments, the transparent adjustment layer has a thickness greater than a sum of the thicknesses of the buffer layer and the second reflective electrode layer.

In some embodiments, the display substrate further includes: a transmissive electrode layer on a side of the electroluminescent layer distal to the first reflective electrode layer; a thin film transistor coupled to the transmissive electrode layer; and a color film layer configured to filter the light emitted by the electroluminescent layer and transmitted through the transmissive electrode layer.

The disclosure further provides a display panel including the above display substrate and a package substrate on a side of the display substrate proximate to the second reflective electrode layer, the package substrate includes at least one light sensing unit, which is in one-to-one correspondence with the at least one electroluminescent layer, to detect the light emitted by the corresponding electroluminescent layer and transmitted through the corresponding overlapping region, and to convert an optical signal into an electrical signal.

In some embodiments, each of the at least one light sensing unit is directly opposite to its corresponding overlapping region.

In some embodiments, an area of the light sensing unit is larger than an area of its corresponding overlapping region.

The disclosure further provides a display apparatus including the above display panel.

The disclosure further provides a method for manufacturing a display substrate including: forming an electroluminescent layer on a substrate; and forming a first reflective electrode layer, a buffer layer and a second reflective electrode layer on a side of the electroluminescent layer distal to the substrate; the buffer layer is provided with a first hollow region, the second reflective electrode layer is provided with a second hollow region, an overlapping region between the first hollow region and the second hollow region allows light emitted by the electroluminescent layer to pass therethrough; and an orthographic projection of the electroluminescent layer on the substrate covers an orthographic projection of the overlapping region on the substrate.

In some embodiments, the forming a first reflective electrode layer, a buffer layer, and a second reflective electrode layer on a side of the electroluminescent layer distal to the substrate includes: forming the first reflective electrode layer on a side of the electroluminescent layer distal to the substrate; forming an insulating film on a side of the first reflective electrode layer distal to the substrate; forming a conductive film on a side of the insulating film distal to the substrate; forming a second opening in the conductive film by removing a part of a material of the conductive film to form the second reflective electrode layer provided with the second hollow region; and forming a first opening in the insulating film by removing a part of a material of the insulating film exposed by the second hollow region to form the buffer layer provided with the first hollow region.

In some embodiments, before the forming the conductive film, the method further includes forming a via hole in the insulating film in a region other than the first hollow region to be formed.

In some embodiments, the first reflective electrode layer has a thickness of 200 Å-1000 Å; and/or a material of the first reflective electrode layer includes one of ITO-Cs, $Li_3PO_3$/Al, MgAg, LiAl, Ca/Ag, Ag/Al, and Ba/Al/ITO.

BRIEF DESCRIPTION OF THE DRAWINGS

In order to more clearly illustrate the technical solutions in the embodiments of the disclosure or in the related art, the drawings used in the description of the embodiments or the related art will be briefly described below. The drawings in the following description are merely some embodiments of the disclosure, and other drawings may be derived by those skilled in the art without an inventive effort.

DETAILED DESCRIPTION

The technical solutions in the embodiments of the disclosure will be described clearly and completely with reference to the drawings in the embodiments of the disclosure, and it is obvious that the embodiments described are only some embodiments of the disclosure, rather than all embodiments. All other embodiments, which can be derived by those skilled in the art from the embodiments disclosed herein without making any creative effort, shall fall within the scope of the disclosure.

Unless otherwise defined, technical or scientific terms used herein shall have the ordinary meaning as understood by those skilled in the art. The terms "first", "second", and the like, as used in the description and in the claims of the disclosure, do not denote any order, quantity, or importance, but rather are used to distinguish one element from another. The word "comprise" or "include", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect.

An OLED device emits light by an organic electroluminescent layer (EL) therein. During operation, the organic electroluminescent layer is aged, the light emission efficiency thereof is gradually reduced, and the light emission brightness thereof is changed. Therefore, how to detect the light emission brightness of the organic electroluminescent layer in real time and adjust the voltages applied to the cathode and the anode according to the detection result to obtain an optimal display state becomes a technical problem urgently needed to be solved by those skilled in the art.

Figure 1:
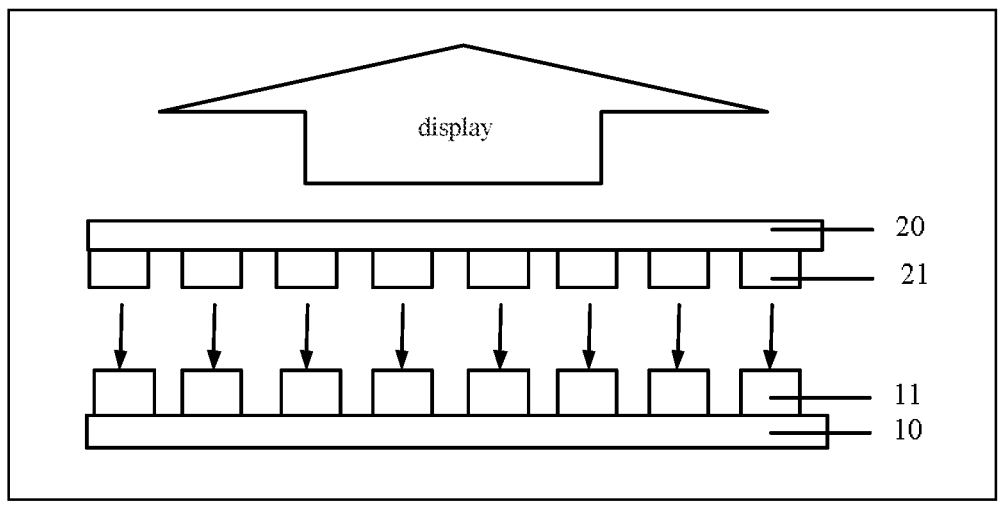
FIG. 1 is a schematic view illustrating a light path of a display panel according to an embodiment of the disclosure.

The display effect of the OLED device is an important parameter for evaluating the quality of a product. In order to obtain the optimal display state, a solution is provided that the voltages applied to the cathode and the anode are adjusted in real time by detecting change of light intensity of the pixel in real time. For example, as shown in FIG. 1, for a bottom emission type OLED device, a light sensing unit (sensor) 11 formed on an encapsulation glass 10 is used to detect the brightness of the light emitted by a light-emitting device 21 on a substrate 20, and the voltages applied to the cathode and the anode are adjusted according to the detection result, thereby obtaining the optimal display state. In order to solve the problem of how to make the light sensing unit 11 detect the light emitted by the light-emitting device 21, the embodiments of the disclosure provide the following technical solution.

Figure 2:
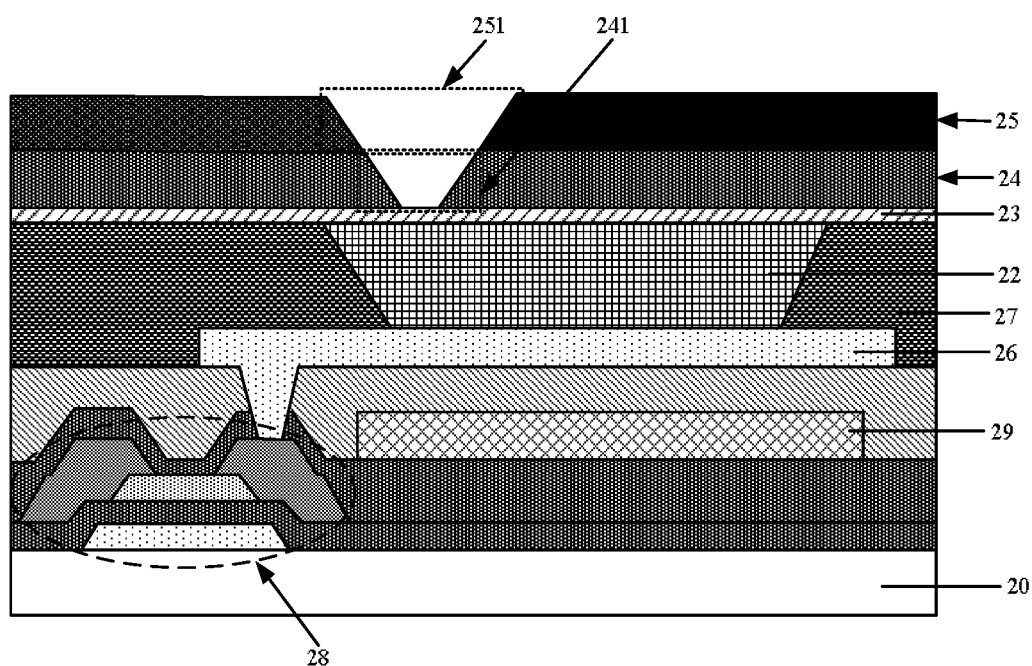
FIG. 2 is a schematic view of a structure of a display substrate according to an embodiment of the disclosure.

A display substrate is provided in the embodiments of the disclosure. As shown in FIG. 2, the display substrate includes: a substrate 20 and an electroluminescent layer 22 on the substrate 20. The display substrate further includes a first reflective electrode layer 23, a buffer layer 24 and a second reflective electrode layer 25 which are sequentially provided on a side of the electroluminescent layer 22 distal to the substrate 20. The buffer layer 24 is provided with a first hollow region 241, and the second reflective electrode layer 25 is provided with a second hollow region 251. The light emitted by the electroluminescent layer 22 transmits through an overlapping region between the first hollow region 241 and the second hollow region 251.

Figure 3:
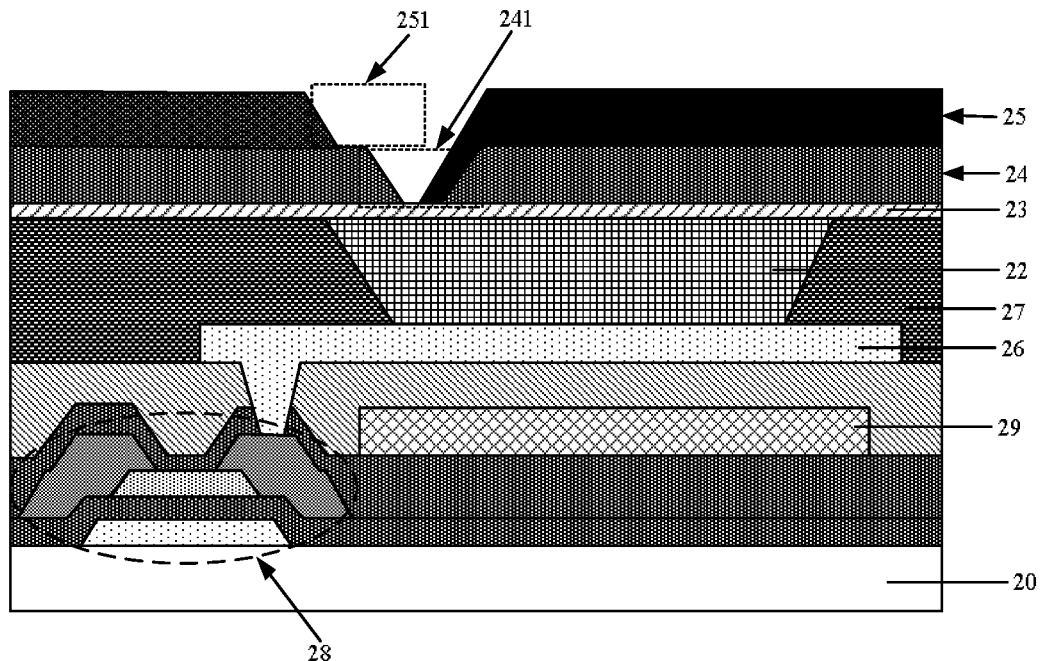
FIG. 3 is a schematic view of a structure of a display substrate according to an embodiment of the disclosure.

It should be noted that, as shown in FIGS. 2 and 3, the buffer layer 24 is provided with the first hollow region 241, and the second reflective electrode layer 25 is provided with the second hollow region 251. The first hollow region 241 and the second hollow region 251 overlap with each other in a thickness direction of the display substrate.

It should be noted that, the buffer layer 24 provided with the first hollow region 241 means that the buffer layer 24 has a first opening formed in the first hollow region 241 (for example, by using a mask). The second reflective electrode layer 25 provided with the second hollow region 251 means that the second reflective electrode layer 25 has a second opening formed in the second hollow region 251 (for example, by using a mask). That is, the material of the buffer layer 24 in the first hollow region 241 is removed to form the first opening, which acts as the first hollow region 241. The material of the second reflective electrode layer 25 in the second hollow region 251 is removed to form the second opening, which acts as the second hollow region 251.

That is, to ensure that the light emitted by the electroluminescent layer 22 exits outside, an orthographic projection of the first opening in the first hollow region on the substrate 20 at least partially overlaps with an orthographic projection of the second opening of the second hollow region on the substrate 20.

The first hollow region 241 in the buffer layer 24 allows only a part of the light emitted by the electroluminescent layer 22 to exit from a backside of the electroluminescent device to the sensor for detection, and the amount of this part of the light cannot be too much to affect the light emission from the frontside of the electroluminescent device. For example, the first hollow region 241 may occupy 5% to 30% of an effective light-emitting region of the electroluminescent layer 22, i.e., the first hollow region 241 may occupy 5% to 30% of a region of a sub-pixel including the electroluminescent layer 22.

The first reflective electrode layer 23 may be an alloy electrode, a laminated electrode, or a composite electrode, and a material of the first reflective electrode layer 23 may be, for example, ITO-Cs (indium tin oxide-cesium). $Li_3PO_3$/Al (lithium phosphate/aluminum), MgAg (magnesium silver). LiAl (lithium aluminum), Ca/Ag (calcium/silver), Ag/Al (silver/aluminum), Ba/Al/ITO (barium/aluminum/indium tin oxide), and the like. In order to ensure transmittance of 30%-50% for the light emitted by the electroluminescent layer 22, the thickness of the first reflective electrode layer 23 may be in a range of 200 Å-1000 Å, for example, 300 Å~400 Å, 500 Å, 600 Å, 700 Å, 800 Å, 900 Å. A material of the second reflective electrode layer 25 may be, for example, metal, such as Al (aluminum). In order to ensure a high reflectivity of the second reflective electrode layer 25, a thickness of the second reflective electrode layer 25 may be in a range of 1000 Å-5000 Å, for example, 1500 Å, 2000 Å, 2500 Å, 3000 Å, 3500 Å, 4000 Å, 4500 Å. A material of the buffer layer 24 may include, for example, SiN (silicon nitride), SiOx (silicon oxide), SiON (silicon oxynitride), Resin (resin base), and the like.

Figure 4:
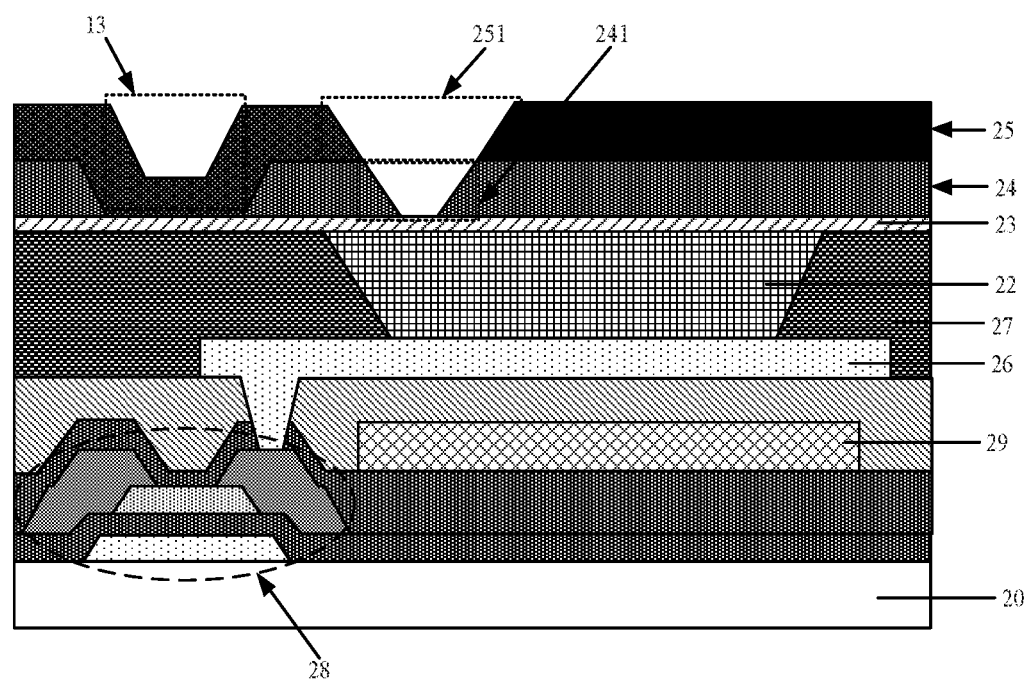
FIG. 4 is a schematic view of a structure of a display substrate according to an embodiment of the disclosure.

In order to ensure a high light transmittance of the first reflective electrode layer 23, a thickness of the first reflective electrode layer 23 is required to be thinner. In this case, the first reflective electrode layer 23 will has a larger resistance. The first reflective electrode layer 23 and the second reflective electrode layer 25 are electrically coupled with each other by a via hole 13 in the buffer layer 24 (as shown in FIG. 4), and the resistance of the first reflective electrode layer 23 may be reduced.

In some embodiments, in order to prevent the light emitted by the electroluminescent layer 22 to the first hollow region 241 from being blocked by the second reflective electrode to increase a sensing region of the light sensing unit, the second hollow region 251 covers the first hollow region 241, as shown in FIG. 2. That is, an outline of the second hollow region 251 surrounds an outline of the first hollow region 241, and the second hollow region 251 exposes the entire first hollow region 241. In this case, the overlapping region between the first hollow region 241 and the second hollow region 251 is the first hollow region 241.

In addition, the overlapping region between the first hollow region 241 and the second hollow region 251 allows the light emitted by the electroluminescent layer 22 to transmit through the overlapping region, and therefore, the overlapping region between the first hollow region 241 and the second hollow region 251 is located in the light-emitting region of the electroluminescent layer 22.

The overlapping region between the first hollow region 241 and the second hollow region 251 acts as a light outgoing region, which is opposite to the light sensing unit. In some embodiments, in order to improve light outgoing efficiency and increase detection accuracy, a region where the electroluminescent layer 22 is located covers the overlapping region between the first hollow region 241 and the second hollow region 251. That is, as shown in FIGS. 2 and 3, the overlapping region between the first hollow region 241 and the second hollow region 251 is located directly above the electroluminescent layer 22 in a thickness direction of the display substrate.

It can be understood that, as shown in FIG. 2, a part of the light emitted by the electroluminescent layer 22 firstly emits to the first reflective electrode layer 23, transmits through the first reflective electrode layer 23, and then emits to the overlapping region between the first hollow region 241 and the second hollow region 251. Then, the light emitted by the electroluminescent layer 22 may transmit through the overlapping region between the first hollow region 241 and the second hollow region 251. Therefore, the light transmittance of the first reflective electrode layer 23 is greater than 0. That is, the first reflective electrode layer 23 should be light transmissive, and a part of the light emitted by the electroluminescent layer 22 can transmit through the first reflective electrode layer 23. Here, the light transmittance of the second reflective electrode layer 25 may be 0, and mainly plays a role of light reflection.

As shown in FIGS. 2 and 3, the substrate 20 is further provided a transmissive electrode layer 26. The electroluminescent layer 22 emits light under driving of the transmissive electrode layer 26 and the first reflective electrode layer 23. A pixel defining layer 27 is in a form of multiple grids to define opening regions, and the electroluminescent layer 22 is within the grid.

As shown in FIGS. 2 and 3, the substrate 20 is further provided with a thin film transistor 28. The transmissive electrode layer 26 acts as the anode, and the first reflective electrode layer 23 acts as the cathode. The thin film transistor 28 is electrically coupled to the transmissive electrode layer 26 to transmit data signals to the transmissive electrode layer 26.

Certainly, depending on the color of light emitted by the electroluminescent layer 22, the substrate 20 may be further provided with color filter units 29, for example in a case that the electroluminescent layer 22 emits white light.

The structures of the display substrates in FIGS. 2 and 3 are merely schematic and not limited thereto.

In the display substrate provided by the embodiments of the disclosure, since the first reflective electrode layer 23 is made of a material with high light transmittance, the light emitted by the electroluminescent layer 22 can transmit through the first reflective electrode layer 23 and through the overlapping region between the first hollow region 241 and the second hollow region 251. When the display substrate is used in a display panel, the light sensing unit can detect the brightness of the light emitted by the electroluminescent layer 22 in real time. Among the light emitted by the electroluminescent layer 22, after the light transmits through the first reflective electrode layer 23 and emits towards the second reflective electrode layer 25, the light directed towards the second hollow region 251 transmits to the light sensing unit, and the light directed towards other regions may be reflected by the second reflective electrode layer 25 back to the electroluminescent layer 22 for utilization, such that a normal display is not affected.

In some embodiments, as shown in FIG. 4, the buffer layer 24 is further provided with a via hole 13. The second reflective electrode layer 25 is electrically coupled to the first reflective electrode layer 23 through the via hole 13. The number of the via holes 13 in the buffer layer 24 is not limited, and the number of the via holes 13 in the display substrate is not required to be equal to the number of the electroluminescent layers 22, as long as the number of the via holes 13 is set to ensure that the second reflective electrode layer 25 and the first reflective electrode layer 23 are electrically coupled to each other.

In addition, the via hole 13 may be directly provided above the electroluminescent layer 22 in the thickness direction of the display substrate. In some embodiments, in order to avoid influence on the first reflective electrode layer on the electroluminescent layer 22 when the via hole 13 is formed, the via hole 13 is provided above a region (i.e., a non-opening region) where the pixel defining layer 27 is located in the thickness direction of the display substrate. In other words, the orthographic projection of the electroluminescent layer 22 on the substrate 20 does not overlap with an orthographic projection of the via hole 13 on the substrate 20.

In some embodiments, the display substrate includes a plurality of electroluminescent layers 22 arranged in an array, and each of the plurality of electroluminescent layers 22 corresponds to an overlapping region in order to monitor the light-emitting brightness of a corresponding one of the plurality of electroluminescent layer 22 in real time. That is, the display substrate is provided with a plurality of electroluminescent layers 22, the buffer layer 24 is provided with a plurality of first hollow regions 241, the second reflective electrode layer 25 is provided with a plurality of second hollow regions 251, and each of the plurality of electroluminescent layers 22 corresponds to a corresponding overlapping region between the first hollow region 241 and the second hollow region 251.

When the display substrate is used in the display panel, each overlapping region corresponds to a light sensing unit, which can monitor the light-emitting brightness of an electroluminescent layer 22 on the display substrate in real time.

Figure 5:
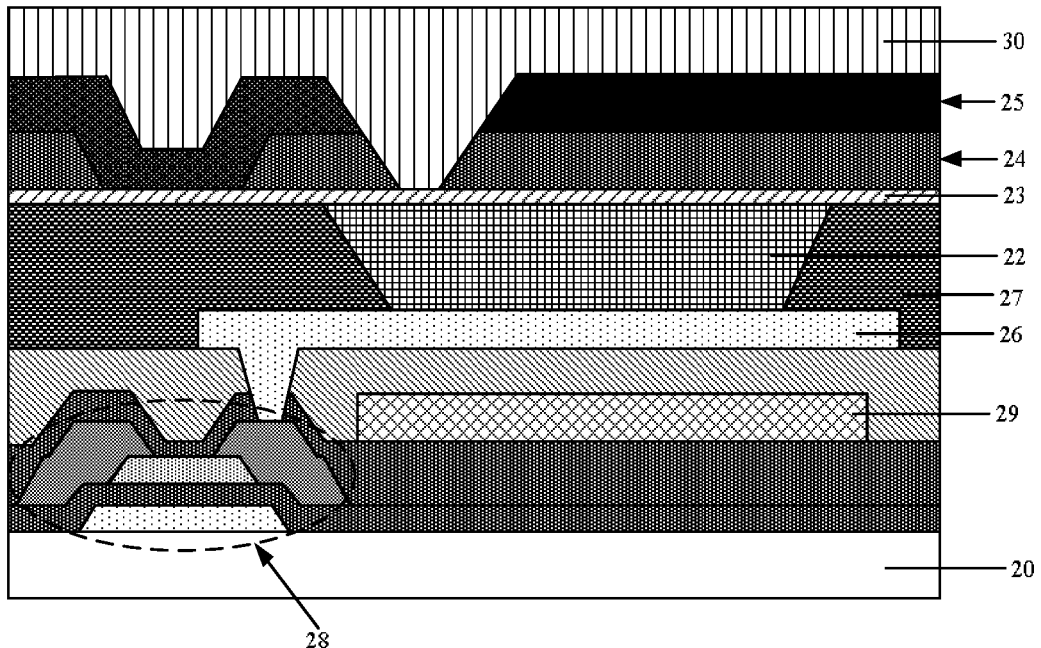
FIG. 5 is a schematic view of a structure of a display substrate according to an embodiment of the disclosure.

In some embodiments, as shown in FIG. 5, the display substrate further includes a transparent adjustment layer 30 on a side of the second reflective electrode layer 25 distal to the substrate 20, and a refractive index of the transparent adjustment layer 30 is greater than that of the first reflective electrode layer 23. In a case that the refractive index of the transparent adjustment layer 30 is greater than that of the first reflective electrode layer 23, an incident angle of the light entering the transparent adjustment layer 30 is greater than a refractive angle of the light emitted from the transparent adjustment layer 30 when the light emitted by the electroluminescent layer 22 is incident on the transparent adjustment layer 30 through the first reflective electrode layer 23, and the transparent adjustment layer 30 converges the light, such that the light sensing unit obtains a good light collecting effect in a small range. To facilitate packaging, in some embodiments, a thickness of the transparent adjustment layer 30 is greater than a sum of the thicknesses of the buffer layer 24 and the second reflective electrode layer 25.

The refractive index of the buffer layer 24 and the refractive index of the second reflective electrode layer 25 are both smaller than the refractive index of the transparent adjustment layer 30, such that the transparent adjustment layer 30 may converge light emitted thereto through the buffer layer 24 and the second reflective electrode layer 25.

Figure 6:
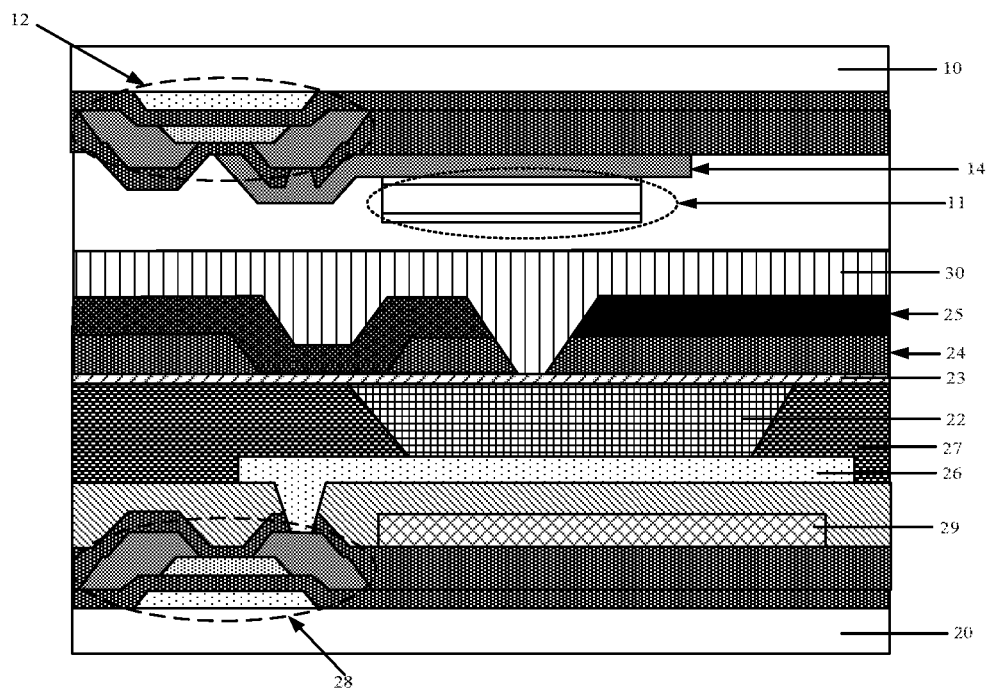
FIG. 6 is a schematic view of a structure of a display substrate according to an embodiment of the disclosure.

A display panel is further provided in the embodiments of the disclosure, as shown in FIG. 6. The display panel includes the above display substrate and further includes a package substrate on a side of the display substrate proximate to the second reflective electrode layer 25. The package substrate includes the light sensing unit 11 (e.g., a photodiode PIN). The light sensing unit 11 is configured to detect light, which is emitted by the electroluminescent layer 22 and transmits through the overlapping region between the first hollow region 241 and the second hollow region 251, and to convert an optical signal into an electrical signal. The packaging substrate is further provided with a thin film transistor 12 and a light sensing unit anode 14. The thin film transistor 12 is electrically coupled to the light sensing unit anode 14 and is configured to supply power to the light sensing unit 11.

It should be noted that, the light emitted by the electroluminescent layer 22 is emitted to the light sensing unit 11 through the overlapping region between the first hollow region 241 and the second hollow region 251, and can be detected by the light sensing unit 11. The number of the overlapping regions may be equal to the number of the electroluminescent layers 22, the number of the overlapping regions may alternatively be smaller than the number of the electroluminescent layers 22, and the number of the overlapping regions may alternatively be larger than the number of the electroluminescent layers 22. In a case that the number of the overlapping regions is equal to the number of the electroluminescent layers 22, the light sensing units 11 detect the brightness of the light emitted by the electroluminescent layers 22 on the display substrate, respectively. In a case that the number of the overlapping regions is smaller than the number of the electroluminescent layers 22, the light sensing units 11 only detect the brightness of light emitted by some of the electroluminescent layers 22 on the display substrate, respectively. In a case that the number of the overlapping regions is larger than the number of the electroluminescent layers 22, multiple light sensing units 11 may detect the brightness of light emitted by one electroluminescent layer 22.

The package substrate includes the light sensing units 11 on the encapsulation glass 10, and the specific structure of the package substrate may be referred to the related art, which is not limited in the embodiments of the disclosure, and the structure of FIG. 6 is merely an example.

According to the received optical signal, the light sensing unit 11 generates an electrical signal corresponding to the optical signal, and the electrical signal is used for representing the light-emitting brightness of the electroluminescent layer 22 corresponding to the light sensing unit 11. During display, an IC (Integrated Circuit) can obtain the light-emitting brightness of the electroluminescent layer 22 according to a magnitude of the electrical signal generated by the light sensing unit 11, so as to determine magnitudes of voltages to be applied to the cathode and the anode for driving the electroluminescent layer 22 to emit light (i.e. determine compensation parameters), thereby performing a real time compensation on the light-emitting brightness of each sub-pixel to achieve an optimal display state.

In order to improve the detection efficiency of the light sensing unit 11, one light sensing unit 11 is directly opposite to one overlapping region between the first hollow region 241 and the second hollow region 251. In order to further improve the detection efficiency of the light sensing unit 11, as shown in FIG. 6, the region where the light sensing unit 11 is located covers the overlapping region directly opposite to the light sensing unit 11. That is, the light sensing unit 11 is directly provided above the overlapping region in the thickness direction of the display panel, and an area of the light sensing unit 11 is larger than that of the overlapping region. For example, the area of the light sensing unit 11 may be twice the area of the overlapping region, such that all the light emitted through the overlapping region is detected by the light sensing unit 11, thereby reducing the area of the overlapping region as small as possible and improving the utilization rate of the light emitted by the electroluminescent layer 22.

The beneficial effects of the display panel provided in the embodiments of the disclosure are the same as those of the display substrate, and are not repeated here.

A display apparatus including the above display panel is further provided in the embodiment of the disclosure. The display apparatus may be any product or component with a display function, such as an OLED display, an OLED television, a digital photo frame, a mobile phone, a tablet computer and a navigator.

Figure 7:
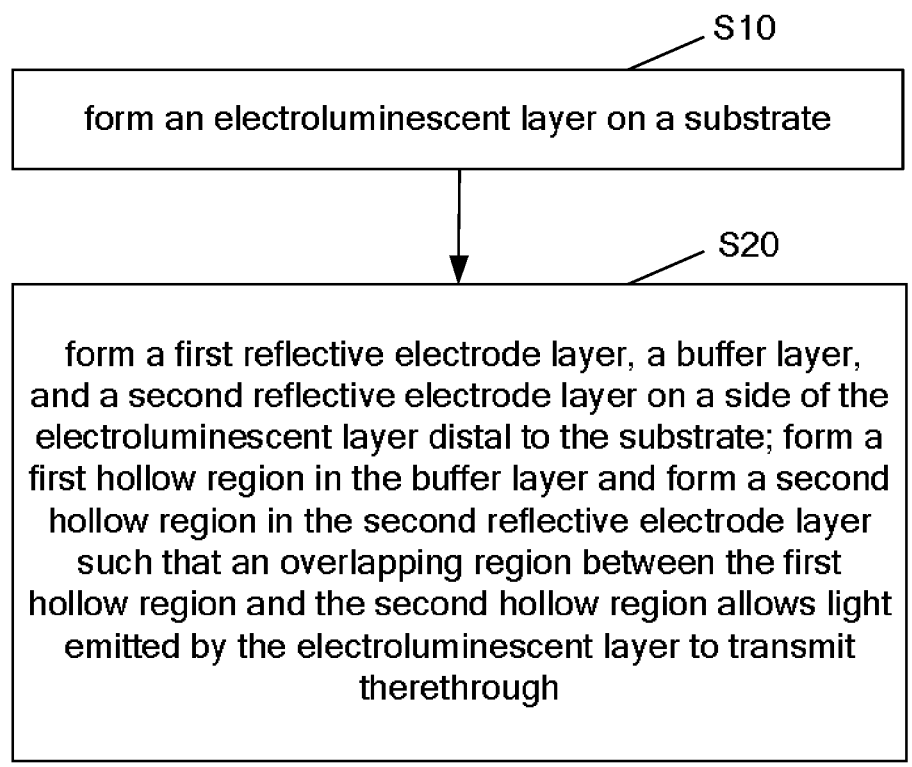
FIG. 7 is a flow chart illustrating a method for manufacturing a display substrate according to an embodiment of the disclosure.

A method for manufacturing the above display substrate is further provided in the embodiments of the disclosure. As shown in FIG. 7, the method for manufacturing the display substrate includes steps S10 to S20.

At step S10, an electroluminescent layer 22 is formed on the substrate 20.

Certainly, taking the display substrate shown in FIG. 3 as an example, before the electroluminescent layer 22 is formed, film layers such as a thin film transistor 28, a color filter unit 29, a transmissive electrode layer 26, and a pixel defining layer 27 may be formed on the substrate 20.

At step S20, a first reflective electrode layer 23, a buffer layer 24, and a second reflective electrode layer 25 are sequentially formed on a side of the electroluminescent layer 22 distal to the substrate 20.

A first hollow region 241 is formed in the buffer layer 24, and a second hollow region 251 is formed in the second reflective electrode layer 25. An overlapping region between the first hollow region 241 and the second hollow region 251 allows the light emitted by the electroluminescent layer 22 to transmit therethrough.

Figure 8:
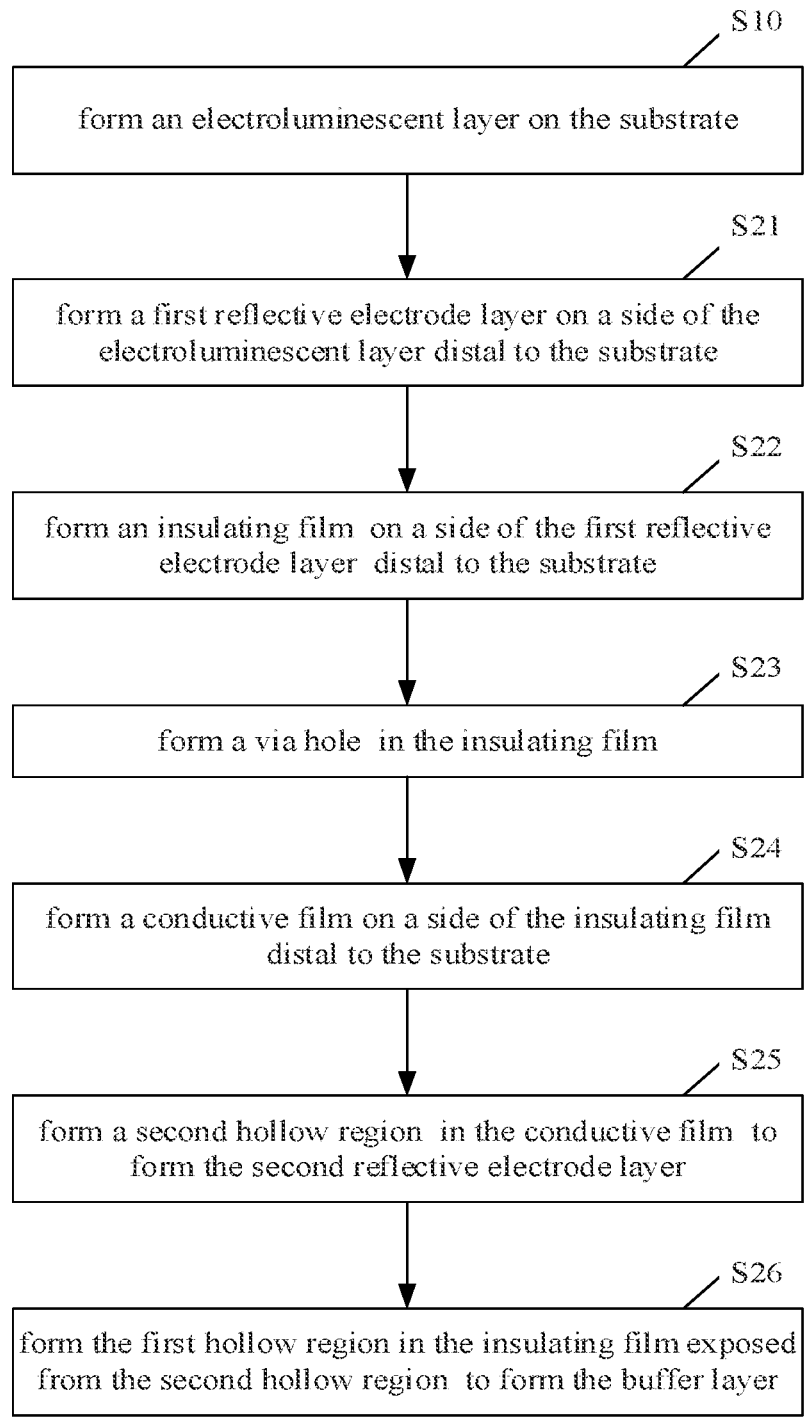
FIG. 8 is a flow chart illustrating a method for manufacturing a display substrate according to an embodiment of the disclosure.

As shown in FIG. 8, in the method for manufacturing the display substrate, the step S20 further includes the following steps S21-S26.

Figure 9A:
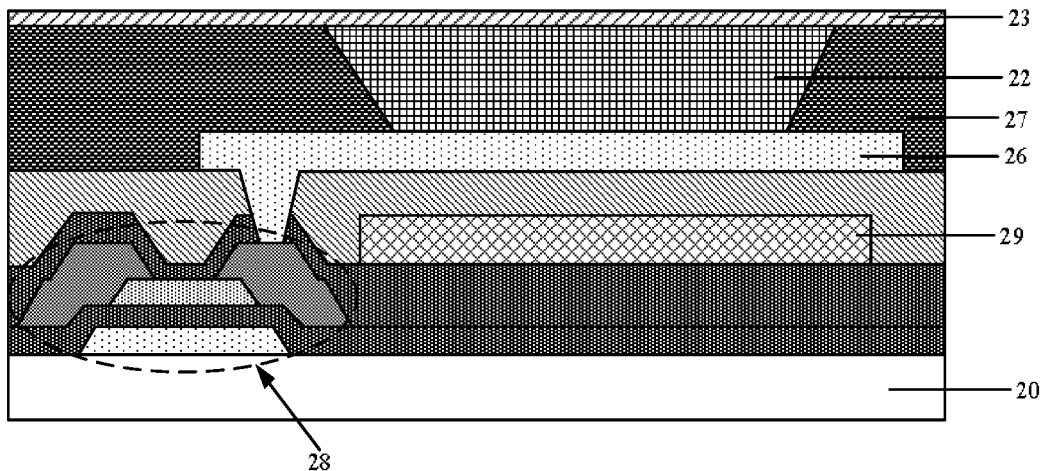
FIGS. 9a-9e are schematic views illustrating a procedure for manufacturing a display substrate according to an embodiment of the disclosure.

At step S21, as shown in FIG. 9a, the first reflective electrode layer 23 is formed on a side of the electroluminescent layer 22 distal to the substrate 20.

Figure 9B:
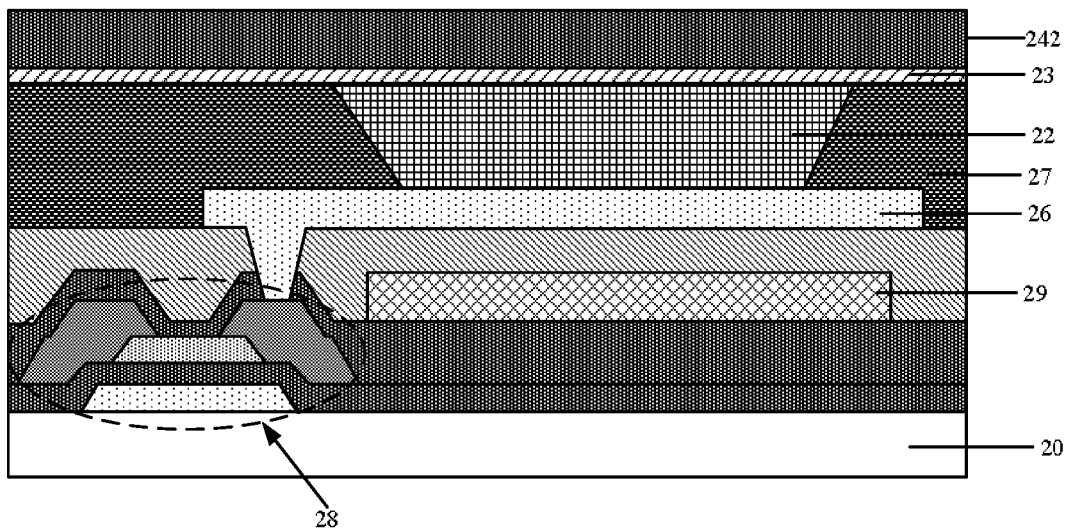

At step S22, as shown in FIG. 9b, an insulating film 242 is formed on a side of the first reflective electrode layer 23 distal to the substrate 20.

In some embodiments, when manufacturing the display substrate shown in FIG. 4, as shown in FIG. 8, the step S20 further includes the following steps S23-S26.

Figure 9C:
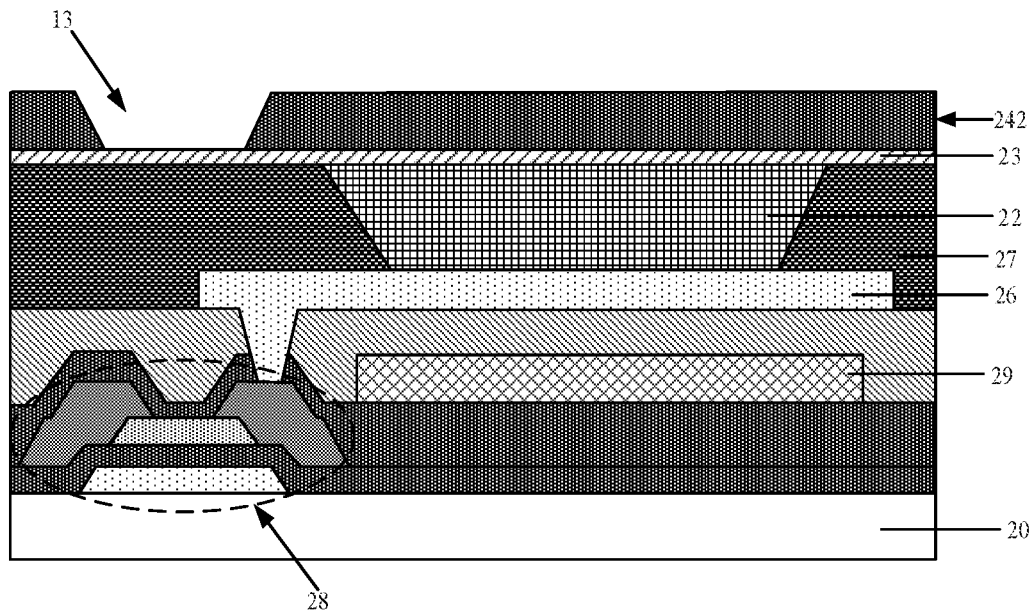

At step S23, as shown in FIG. 9c, a via hole 13 is formed in the insulating film 242.

That is, after the insulating film 242 is formed and before a conductive film 252 is formed, the step S23 is further included. If the display substrate shown in FIG. 3 is manufactured, the step S23 is not required, and a step S24 is performed after the step S22 is completed.

Figure 9D:
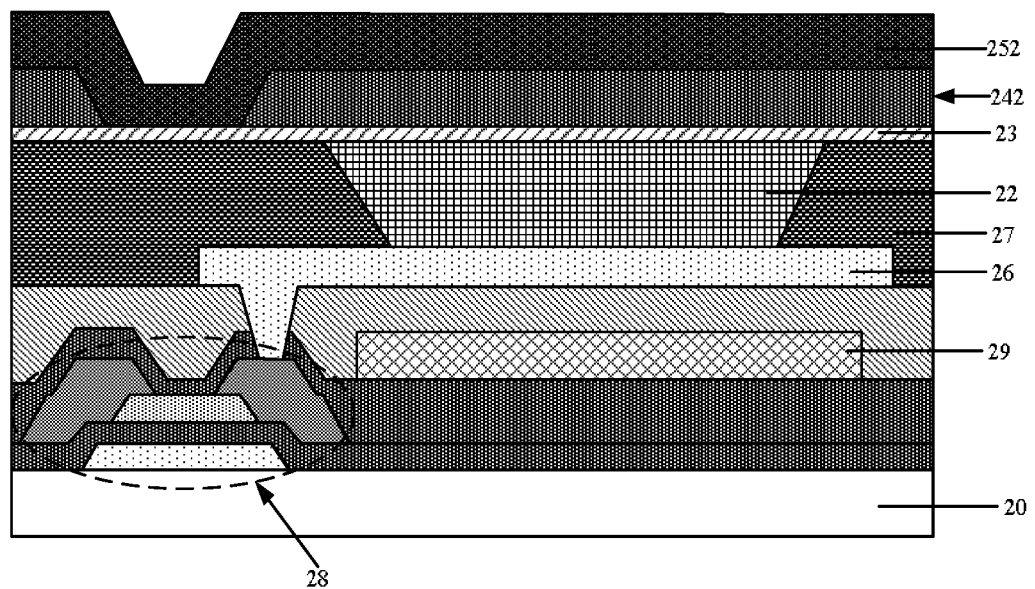

At step S24, as shown in FIG. 9d, the conductive film 252 is formed on a side of the insulating film 242 distal to the substrate 20.

Figure 9E:
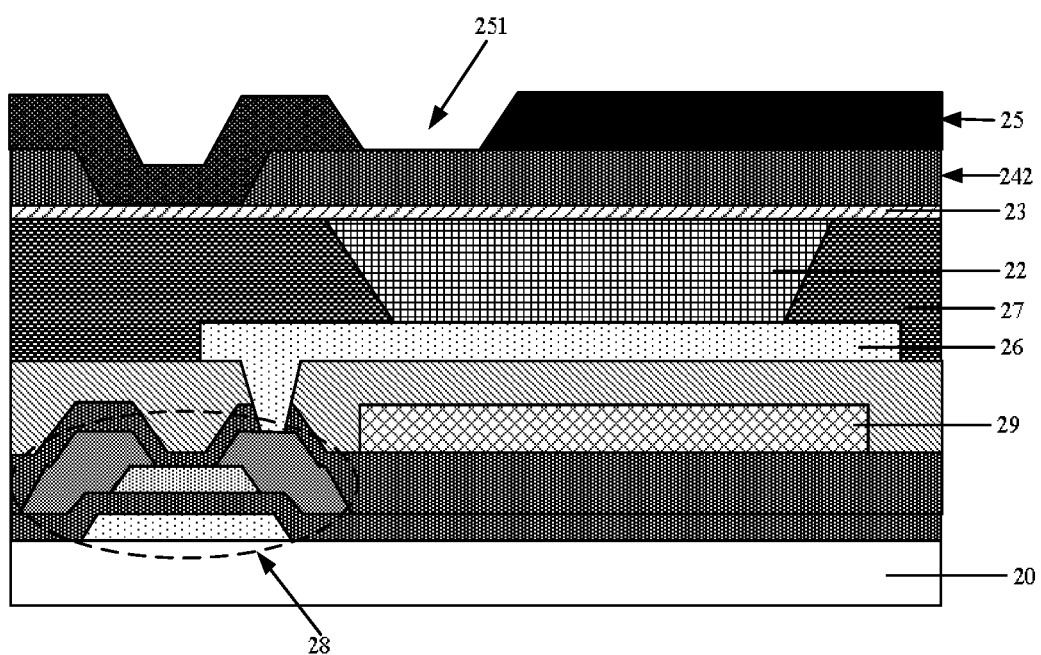

At step S25, as shown in FIG. 9e, the second hollow region 251 is formed in the conductive film 252 to form the second reflective electrode layer 25.

At step S26, as shown in FIG. 4, the first hollow region 241 is formed in the insulating film 242 at a region exposed by the second hollow region 251 to form the buffer layer 24.

In the method for manufacturing the display substrate provided by the embodiments of the disclosure, by providing the buffer layer 24 on the first reflective electrode layer 23 and then providing the second reflective electrode layer 25, on one hand, the first reflective electrode layer 23 does not need to be thinned, the thickness of the first reflective electrode layer 23 can be accurately controlled, the electroluminescent layer 22 is not damaged, and the product quality is ensured; on the other hand, the second reflective electrode layer 25 ensures the utilization rate of the light emitted by the electroluminescent layer 22, which does not affect the normal display, and the first reflective electrode layer 23 is not damaged in a case that the first hollow region 241 is formed in the buffer layer 24 after the second hollow region 251 is formed in the second reflective electrode layer 25.

Figure 10:
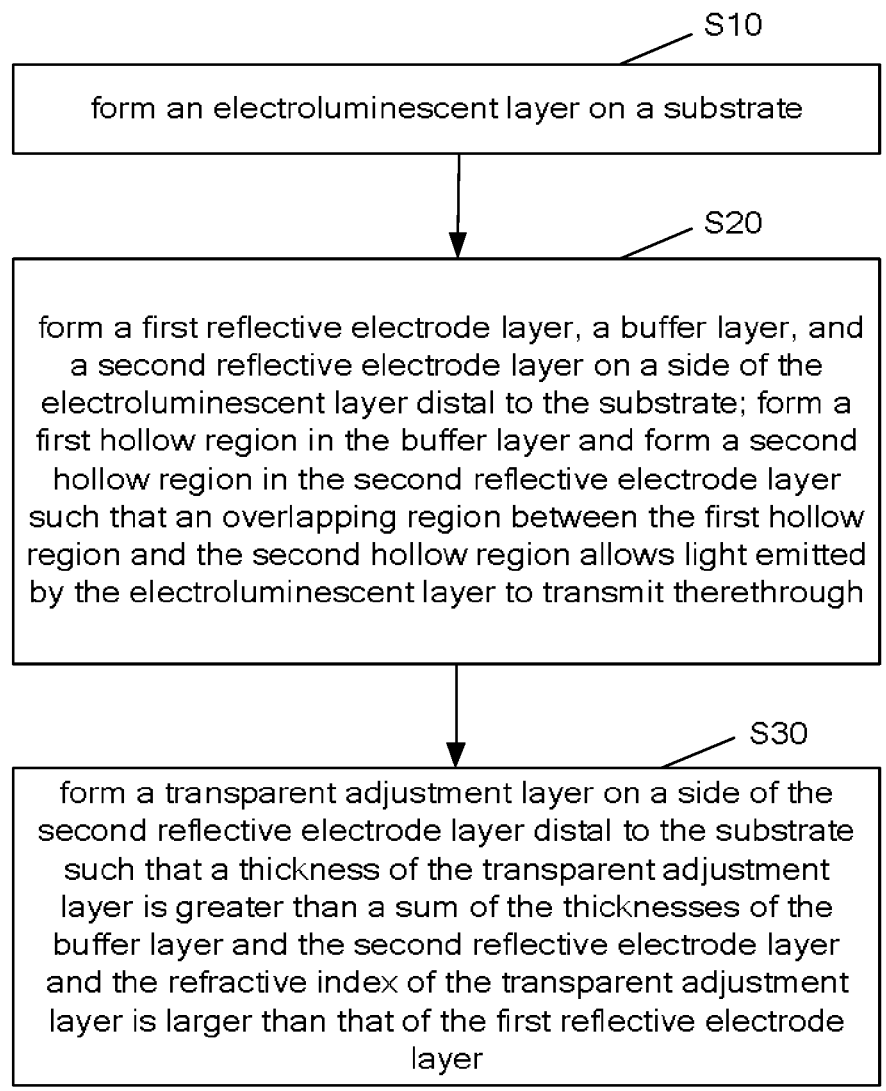
FIG. 10 is a flow chart illustrating a method for manufacturing a display substrate according to an embodiment of the disclosure.

As shown in FIG. 10, the method for manufacturing the display substrate further includes the following step S30.

At step S30, as shown in FIG. 5, a transparent adjustment layer 30 is formed on a side of the second reflective electrode layer distal to the substrate 20. The thickness of the transparent adjustment layer 30 is greater than the sum of the thicknesses of the buffer layer 24 and the second reflective electrode layer 25. The refractive index of the transparent adjustment layer 30 is larger than the refractive index of the first reflective electrode layer 23.

In some embodiments, to facilitate packaging, the thickness of the transparent adjustment layer 30 is greater than the sum of the thicknesses of the buffer layer 24 and the second reflective electrode layer 25.

The embodiments of the disclosure provide a display substrate and a manufacturing method thereof, a display panel and a display apparatus. The light emitted by the electroluminescent layer may transmit through the first reflective electrode layer which is made of a material with higher light transmittance, and may be emitted through the overlapping region between the first hollow region and the second hollow region. When the display substrate is used in the display panel, the light sensing unit can detect the light-emitting brightness of the light emitted by the electroluminescent layer in real time. Among the light emitted by the electroluminescent layer, after the light transmits through the first reflective electrode layer and emits to the second reflective electrode layer, the light directed towards the second hollow region emits to the light sensing unit, and the light directed towards other regions is reflected by the second reflective electrode layer back to the electroluminescent layer for utilization, such that a normal display is not affected.

The above description is only for the specific embodiments of the disclosure, but the scope of the disclosure is not limited thereto, and any person skilled in the art can easily think of changes or substitutions within the scope of the disclosure, and shall be included in the scope of the disclosure. Therefore, the protection scope of the disclosure should be defined by the protection scope of the claims.

What is claimed is:

1. A display substrate, comprising a substrate and a plurality of electroluminescent layers on the substrate, wherein the display substrate further comprises a first reflective electrode layer, a buffer layer and a second reflective electrode layer in direct contact with the buffer layer on a side of at least one of the plurality of electroluminescent layers distal to the substrate;

the buffer layer is provided with a first opening extending along a thickness direction of the buffer layer as a first hollow region, the second reflective electrode layer is provided with a second opening extending along a thickness direction of the second reflective electrode layer as a second hollow region, the first opening is communicated with the second opening, and an overlapping region between the first hollow region and the second hollow region is configured to transmit light emitted by the electroluminescent layer, and an orthographic projection of the at least one of the plurality of electroluminescent layers on the substrate covers an orthographic projection of the overlapping region on the substrate;

wherein the first reflective electrode layer has a thickness of 200 Å-1000 Å;

wherein a material of the first reflective electrode layer comprises one of ITO-Cs, $Li_3PO_3$/Al, MgAg, LiAl, Ca/Ag, Ag/Al, and Ba/Al/ITO; and wherein an area of the orthographic projection of the overlapping region on the substrate is 5% to 30% of an area of the orthographic projection of the electroluminescent layer on the substrate.

2. The display substrate of claim 1, wherein a via hole is further provided in the buffer layer in a region other than the first hollowed region, and the second reflective electrode layer is electrically coupled to the first reflective electrode layer through the via hole.

3. The display substrate of claim 2, wherein the second reflective electrode layer has a thickness of 1000 Å-5000 Å.

4. The display substrate of claim 3, wherein a material of the second reflective electrode layer comprises aluminum.

5. The display substrate of claim 4, wherein the orthographic projection of the electroluminescent layer on the substrate does not overlap with an orthographic projection of the via hole on the substrate.

6. The display substrate of claim 5, further comprising a pixel defining layer on the substrate and in a same layer with the plurality of electroluminescent layers, wherein the pixel defining layer defines a plurality of grids, and the plurality of electroluminescent layers are in the grids of the pixel defining layer, respectively; and the via hole is formed above the pixel defining layer.

7. The display substrate of claim 6, further comprising a transparent adjustment layer on a side of the second reflective electrode layer distal to the substrate, wherein a refractive index of the transparent adjustment layer is larger than a refractive index of the first reflective electrode layer; and/or the refractive index of the transparent adjustment layer is larger than each of a refractive index of the buffer layer and a refractive index of the second reflective electrode layer.

8. The display substrate of claim 7, wherein the transparent adjustment layer has a thickness greater than a sum of a thickness of the buffer layer and the thickness of the second reflective electrode layer.

9. The display substrate of claim 8, further comprising:

a transmissive electrode layer on a side of the electroluminescent layer distal to the first reflective electrode layer;

a thin film transistor coupled to the transmissive electrode layer; and a color film layer configured to filter the light emitted by the electroluminescent layer and transmitted through the transmissive electrode layer.

10. A display panel comprising the display substrate of claim 1, and a package substrate on a side of the display substrate proximate to the second reflective electrode layer; wherein the package substrate comprises at least one light sensing unit, which is in one-to-one correspondence with the at least one electroluminescent layer, to detect the light emitted by the corresponding electroluminescent layer and transmitted through the corresponding overlapping region, and to convert an optical signal into an electrical signal.

11. The display panel of claim 10, wherein the at least one light sensing unit is directly opposite to its corresponding overlapping region.

12. The display panel of claim 11, wherein an area of the light sensing unit is larger than an area of its corresponding overlapping region.

13. A display apparatus, comprising the display panel of claim 10.

14. A method for manufacturing a display substrate, comprising:

forming an electroluminescent layer on a substrate; and forming a first reflective electrode layer, a buffer layer and a second reflective electrode layer on a side of the electroluminescent layer distal to the substrate;

wherein the buffer layer is provided with a first hollow region, the second reflective electrode layer is provided with a second hollow region such that an overlapping region between the first hollow region and the second hollow region allows light emitted by the electroluminescent layer to pass therethrough; and an orthographic projection of the electroluminescent layer on the substrate covers an orthographic projection of the overlapping region on the substrate, wherein the forming the first reflective electrode layer, a buffer layer, and a second reflective electrode layer on a side of the electroluminescent layer distal to the substrate comprises:

forming the first reflective electrode layer on a side of the electroluminescent layer distal to the substrate;

forming an insulating film on a side of the first reflective electrode layer distal to the substrate;

forming a conductive film on a side of the insulating film distal to the substrate;

forming a second opening in the conductive film by removing a part of a material of the conductive film to form the second reflective electrode layer provided with the second hollow region; and forming a first opening in the insulating film by removing a part of a material of the insulating film exposed by the second hollow region to form the buffer layer provided with the first hollow region.

15. The method for manufacturing a display substrate of claim 14, wherein before the forming the conductive film, the method further comprises forming a via hole in the insulating film in a region other than the first hollow region to be formed.

16. The method for manufacturing a display substrate of claim 15, wherein the first reflective electrode layer has a thickness of 200 Å-1000 Å; and/or a material of the first reflective electrode layer comprises one of ITO-Cs, $Li_3PO_3$/Al, MgAg, LiAl, Ca/Ag, Ag/Al, and Ba/Al/ITO.

* * * * *